US008952342B2

(12) United States Patent
Peijster et al.

(10) Patent No.: US 8,952,342 B2
(45) Date of Patent: Feb. 10, 2015

(54) SUPPORT AND POSITIONING STRUCTURE, SEMICONDUCTOR EQUIPMENT SYSTEM AND METHOD FOR POSITIONING

(75) Inventors: Jerry Peijster, Maartensdijk (NL); Aditya Mehendale, Enschede (NL); Andre Johannes Maria Hilderink, Haaksbergen (NL)

(73) Assignee: Mapper Lithography IP B.V., Delft (NL)

( * ) Notice: Subject to any disclaimer, the term of this patent is extended or adjusted under 35 U.S.C. 154(b) by 128 days.

(21) Appl. No.: 12/970,842

(22) Filed: Dec. 16, 2010

(65) Prior Publication Data
US 2011/0147612 A1   Jun. 23, 2011

Related U.S. Application Data

(60) Provisional application No. 61/287,657, filed on Dec. 17, 2009, provisional application No. 61/287,661, filed on Dec. 17, 2009.

(51) Int. Cl.
*H01J 37/20* (2006.01)

(52) U.S. Cl.
CPC .................. *H01J 37/20* (2013.01)
USPC .................. 250/491.1; 250/442.11

(58) Field of Classification Search
USPC .................. 250/442.11, 491.1, 492.2
See application file for complete search history.

(56) References Cited

U.S. PATENT DOCUMENTS

| | | | | |
|---|---|---|---|---|
| 4,310,764 A | * | 1/1982 | Iijima | 250/440.11 |
| 4,331,285 A | * | 5/1982 | Gottwals | 228/173.6 |
| 4,560,880 A | | 12/1985 | Petric et al. | |
| 4,607,167 A | | 8/1986 | Petric | |
| 6,038,013 A | | 3/2000 | Ohsaki | |
| 6,130,517 A | * | 10/2000 | Yuan et al. | 318/640 |
| 6,504,599 B2 | * | 1/2003 | Sato | 355/72 |
| 6,839,959 B1 | * | 1/2005 | Hosotani et al. | 29/740 |
| 6,864,601 B2 | * | 3/2005 | Sogard | 310/12.25 |
| 6,897,458 B2 | | 5/2005 | Wieland et al. | |
| 6,940,582 B1 | * | 9/2005 | Tanaka | 355/53 |
| 6,958,804 B2 | | 10/2005 | Wieland et al. | |
| 7,084,414 B2 | | 8/2006 | Wieland et al. | |
| 7,129,502 B2 | | 10/2006 | Kruit | |
| 7,221,463 B2 | * | 5/2007 | Mizuno et al. | 356/614 |
| 7,230,257 B2 | * | 6/2007 | Uchida | 250/492.22 |

(Continued)

FOREIGN PATENT DOCUMENTS

| | | |
|---|---|---|
| EP | 1001512 A2 | 5/2000 |
| EP | 1107068 B1 | 6/2001 |
| EP | 1321822 A1 | 6/2003 |
| EP | 1577929 B1 | 9/2005 |
| EP | 1580602 A1 | 9/2005 |
| EP | 1744215 A1 | 1/2007 |
| JP | 2003-022960 A | 1/2003 |
| JP | 2003-106490 A | 4/2003 |
| JP | 2004-095855 A | 3/2004 |
| JP | 2005-310808 A | 11/2005 |
| JP | 2006-238638 A | 9/2006 |
| JP | 2008-251619 A | 10/2008 |
| WO | 2004055607 A2 | 7/2004 |
| WO | 2005013027 A1 | 2/2005 |
| WO | 2005047979 A2 | 5/2005 |
| WO | 2011074962 A3 | 6/2011 |
| WO | 2011074962 A4 | 6/2011 |

*Primary Examiner* — Jack Berman
*Assistant Examiner* — Eliza Osenbaugh-Stewart
(74) *Attorney, Agent, or Firm* — Blakley Sokoloff Taylor & Zafman

(57) ABSTRACT

The invention relates to a charged particle system provided with a support and positioning structure for supporting and positioning a target on a table, the support and positioning structure comprising a first member and a second member and at least one motor so as to move the first member relative to the second member, wherein a shield is present to shield at least one charged particle beam from electromagnetic fields generated by said at least one motor, the support and positioning structure further comprising a spring mechanically coupling the first member and the second member for at least partially bearing the weight of the first member, table and target.

18 Claims, 3 Drawing Sheets

(56) References Cited

U.S. PATENT DOCUMENTS

| | | | |
|---|---|---|---|
| 7,375,479 B2 | 5/2008 | Van Eijk et al. | |
| 7,505,114 B2 | 3/2009 | Butler | |
| 2002/0096640 A1* | 7/2002 | Tanaka | 250/397 |
| 2003/0007140 A1 | 1/2003 | Korenaga | |
| 2003/0155882 A1* | 8/2003 | Ono et al. | 318/649 |
| 2003/0226976 A1* | 12/2003 | Tanaka | 250/442.11 |
| 2003/0230729 A1* | 12/2003 | Novak et al. | 250/492.2 |
| 2004/0041103 A1 | 3/2004 | Korenaga | |
| 2007/0057196 A1 | 3/2007 | Matsushima | |
| 2008/0054838 A1 | 3/2008 | Butler et al. | |
| 2008/0309911 A1 | 12/2008 | Maria De Vos et al. | |

\* cited by examiner

SUPPORT AND POSITIONING STRUCTURE, SEMICONDUCTOR EQUIPMENT SYSTEM AND METHOD FOR POSITIONING

This is a non-provisional application claiming the benefit of U.S. Provisional Application No. 61/287,657 filed Dec. 17, 2009, and U.S. Provisional Application No. 61/287,661 filed Dec. 17, 2009.

BACKGROUND OF THE INVENTION

1. Field of the Invention

The invention relates to a semiconductor equipment system provided with a support and positioning structure that comprises a first member and a second member and at least one motor.

The invention further relates to such support and positioning structure and to the use thereof.

2. Description of the Related Art

Support and positioning structures are widely used in semiconductor equipment systems, such as lithographic systems and inspection systems. In the case of a lithographic system, the first member is for instance a wafer stage onto which a semiconductor wafer may be attached. A typical example of a measurement system is an electron microscope. In order to achieve high resolutions as under development for lithography applications in the nanometer range, precise positioning is as much needed as the improved resolution of the optical or electro-optical system.

One example of such a system is known from U.S. Pat. No. 4,607,167. The known system is a charged particle beam lithography machine. The machine includes a column with an electron source, an illumination unit, a scanning deflector and a projection lens. This column is present within a vacuum envelope, so as not to disturb the electron beams. The positioning and support structure is present outside the vacuum envelope. This support structure comprising a first member with an exposed surface onto which a semiconductor wafer or a mask may be placed. Hereinafter, the term wafer is understood also to include mask. The structure further comprises a second member including an x-axis drive and an y-axis drive, as well as positioning sensors. Linear motors are preferably used for the translation in the x-y plane. Three independently controlled actuators are present between the first member and the second member. Both the distance of the wafer to the column as well as the angle in the z-x plane and z-y planes is therewith controlled. Hence, an accurate positioning is achieved. More recently, Lorenz motors have been proposed for the actuators between the first member and the second member. The projection lens is shielded against any electromagnetic fields originating from the actuators and linear motors through a shield directly around the working beam, i.e. an internal conical surface member of the vacuum envelope is fabricated from a ferromagnetic material.

It is a disadvantage of the known system that the vacuum environment is localized and does not include the positioning and support structure. The positioning of actual target surface outside the vacuum environment strongly increases the risk of mistakes when transferring a pattern to the target surface. This holds in particular for any system operating with charged particle beams, but also for any other system wherein a controlled atmosphere is used. A vacuum environment is proposed also for EUV (Extreme UV)-optical lithography systems. An environment with a lower pressure may well be required in various assembly steps, for instance for the formation of cavities with a controlled atmosphere such as needed for certain micro-electro-mechanical system (MEMS)-elements. The use of a portion of the vacuum envelope as shield in the known system makes that also another shielding design is needed.

Another example is known from U.S. Pat. No. 7,221,463. The known semiconductor equipment system comprises a support and positioning structure with a first and second member. The positioning structure specifically positions mirrors within a column of the equipment system. Linear motors are provided as actuators. Such motors typically comprise a coil and a permanent magnet, wherein the coil is provided on the second, fixed member and the permanent magnet is provided on the first, moving member. A spring for bearing the tare weight of the first, movable member is placed between the centers of the first member and the second member to alleviate the thrust force of the linear motor in the z-direction. This tare compensation spring is designed to have very small spring constants in a tare bearing direction and other five degree-of-freedom directions, so that transfer of vibrations from the second, fixed member through the spring to the first, movable member is almost negligible. The spring may for instance be a helical coil spring, but other embodiments are also possible. Cooling means may be present for cooling an optical element provided in the first, movable member. These are preferably provided in the second, fixed member, so that the optical element can be cooled in a noncontact manner. Noncontacting cooling means includes radiation cooling. A preferred implementation is cooling of a radiation member using a Peltier element, and cooling of the movable part using radiation from the radiation member.

It is a disadvantage of this known system that radiation cooling does not function adequate in vacuum or near-vacuum environments. Moreover, the use of a Peltier element in addition to radiation cooling complicates the equipment system. Such complexity is undesired and to be avoided unless strictly necessary.

SUMMARY OF THE INVENTION

It is therefore an object to provide a semiconductor equipment system with a positioning and support structure that can be positioned in vacuum and nevertheless allows sufficient shielding of its actuators.

This object is achieved in that the structure comprises a first member and a second member and at least one motor, wherein a shield is present so as to shield the surface of the first member from electromagnetic fields generated by said at least one motor, which shield comprises a first shield part and a second shield part, which first member comprises said first shield part and which second member comprises said second shield part, the first and second shield part being movable towards each other.

The invention thus creates a shield composed of a first and a second shield part. These shield parts are mutually fitted with an amount of play sufficient in order to enable an appropriate positioning. Still, the first and second shield part together allow for sufficient shielding of the motors.

Preferably, the first and second shield part comprise planar portions and side portions. Suitably, the side portion extends substantially perpendicular to the planar portion. Alternative orientations and alternative shapes such as a hemispherical side portion, are not excluded.

Most suitably, the side portions demonstrate mutual overlap. It has been found that such overlap of the side portions dramatically improves the overall performance of the shield, even though the elements to be shielded are on top of the motors instead of aside thereof. A preferred measure of overlap is expressed as the ratio between the distance between such side portions and the length of overlap. This length is defined in the z-direction, which is the direction normal to the exposed surface of the second member. Suitably, the length of overlap is at least fivefold the distance between the side portions. More suitably, the ratio is even 8, 10 or larger than 10.

In a preferred embodiment, at least one of the shield parts comprises a first and a second part, between which the side portion of the other shield part extends. Such a sandwich structure turns out very effective for shielding the fields, which are particularly magnetic fields. An appropriate shielding is needed; while the fields generated by the at least one motor may be in the order of one or more Teslas, the allowed magnetic field in the active portion of the equipment system will be less than milliTeslas or less. This clearly depends on the specific active portion. The allowed magnetic field in an active portion including a charged particle beam is presumably lower than the allowed field in an active portion of an assembly type equipment. In charged particle beam systems, the allowed magnetic field may well be less than microTeslas or even in the order of nanoTeslas.

In order to meet such challenging demands of reducing the field to a millionth or less, while still enabling movement, the at least one shield part preferably has a comb structure. This allows that the two shield parts together constitute an interdigitated structure. It is observed therewith, that not all spaces of the structure need to be filled; e.g. if one shield part has a comb structure with for instance six plates, the other shield part may have twice two plates with a space between the sets of two.

The term 'movement' in the context of the present application does not merely refer to movement in one of the directions parallel and perpendicular to the exposed surface (generally referred to as x, y and z directions), but also to rotations in the xy plane, in the xz plane and/or in the yz plane. In other words, it is preferably movement in all six degrees of freedom. As a consequence, it is suitable that sufficient motors are available to serve movement in all degrees of freedom. This can for instance be six or seven motors. However, the present positioning and support structure may also be applied in situations where less degrees of freedom are available. Examples include the assembly of mirrors, projection lenses.

Preferably, the movement enabled in the invention is sufficient to do fine-tuning. The lateral translation in one direction is preferably less than 1 mm and more suitably less than a tenth of a millimeter. The rotational movement in the xy plane is preferably less than 30 mrad and more suitably less than 3 mrad.

An advantageous effect of constructing the support structure in this manner using an interdigitated shielding arrangement is the high ease of assembly and dis-assembly. The interdigitated shielding arrangement not only enables relative movement between but also allows the first and second shield part to be placed or separated without mechanically disturbing the shield parts.

In a further embodiment, wherein the support and positioning structure is provided with a non-operative state in addition to an operative state, in which non-operative state the at least one motor is turned off and the first and the second member are at mutually increased distance without effecting a leakage in the shield. When putting said motors off or at low power, a stable position is to be ensured for the first member. In this embodiment, the stable position is a position, in which the first and second members are at mutually increased distance. Particularly, the distance is increased or decreased along the z-direction, i.e. the direction parallel to any side portions of the shield parts. The increase in mutual distance is limited so as not to make a leak in the shield.

In a further embodiment, the support and positioning structure is provided with a first and second shield part, the first and second shield parts being of a circular shape. Here the overlap between the first and second shield part is established by placing the first and second shield part in a concentric configuration. In this embodiment the first and second shield parts may also comprise additional circular shield parts to form the interdigitated comb structure. In this manner rotational freedom of movement is maximized.

In another embodiment, the support and positioning structure is provided with a first and an adjacent second side face that mutually include an oblique angle, e.g. an angle between 90 and 180 degrees. It turns out that such a polygonal shape of the support and positioning structure maximizes freedom of movement in any of the six degrees of freedom.

In another aspect of the invention, a method of positioning an element in the semiconductor equipment system is provided. This method comprises the steps of mechanically coupling said element to a first member of a support and positioning structure that further comprises a second member and at least one motor; operating the at least one motor for positioning the first member relative to the second member, and shielding a column above said first member from electromagnetic fields generated by said at least one motor using a distributed shield comprising a first and a second shield part for enabling movement of the first member relative to the second member resulting from said motor operation.

In a second aspect of the invention, the support and positioning structure of the semiconductor equipment system comprises a first member and a second member; a spring mechanically coupling the first member and the second member; and a plurality of electromagnetic motors so as to move the first member relative to the second member. The structure is provided with an operative state and a non-operative state, in which non-operative state at least some of said motors are in a low-power mode.

Operating motors in a low-power mode has a positive effect on heat dissipation, especially when the motors are turned off in the low power mode. It has now been the insight of the inventor that at least some of said motors may be put into a low-power mode, in that the positioning structure is first brought into a non-operative state. The structure is provided, in this non-operative state, with a predefined configuration for at least some of the degrees of freedom. Though the non-operative state does not allow precise positioning, this is not needed in such a non-operative state. The positioning and support structure is intended for fine-tuning. While carrying out large-scale movement, fine-tuning is not needed. As long as a target is absent, fine-tuning is not needed. During operation, a positioning phase may be followed by a stabilizing phase without changes in position but with a need for stabilizing a position against mechanical vibrations. In such a situation, less fine-tuning is needed. In all of these situations, the positioning and support structure may be put into a non-operative state. This non-operative state may comprise the fixation of the degrees of freedom that require the most energy to control and position whilst still allowing control and positioning for degrees of freedom where fine-tuning is not needed.

Overall, the use of a non-operative state supports an energy efficient operation suitable for use in a vacuum environment. Particularly, such energy efficient operation allows carrying out of an operation on one target, such as a wafer, without a need to do an intermediate recalibration. Such recalibration is due as a consequence of a change in temperature and therewith a change in dimensions. The term 'carrying out an operation on a target' is herein meant to express that the operation enabled by the equipment system is carried out for one complete wafer, or a relevant portion thereof, as defined by a user. Such operation may be the transfer of a pattern, an inspection step, an assembly step etc.

Preferably, the position of the non-operative state is also used as a reference position. In a further implementation, the spring has an effective length that is longer in the non-operative state than in the operative state. In this manner, a distance between the first and the second member is increased. The distance is particularly a distance along the z-direction, i.e. normal to a main surface of the first member.

Specifically, a sensor is provided for sensing a removal of an element from said first member, said sensor being coupled to a control unit that controls a transition between the operative and the non-operative state, said control unit switching off said motors. The use of sensors is a suitable implementation for defining said transition to the non-operative state. Alternatively and/or additionally, the transition to said non-operative state may be started on the basis of comparison with other actions within the system, and/or after that one of the positioners has finalized a predefined positioning step. Suitably, a spring holder is provided for defining a maximum length of the spring. When removing an element from said member, a counter force working on the spring is typically reduced. As a result, the spring will take on a larger length. The additional extension may however be too large to ensure a stable and well-defined position and/or a well-defined extension. The latter is particularly relevant in case of implementing a shield with a first and second shield part in an interdigitated configuration as discussed before. The spring holder now defines a maximum position. Suitably, more than one spring holder is present so as to specify not only a maximum extension, but also specify fixed positions for other degrees of freedom.

In another aspect, a method of positioning an element in the semiconductor equipment system. The method comprises the steps of: mechanically coupling said element to a first member of a support and positioning structure that further comprises a second member and at least one motor; operating the at least one motor for positioning the first member relative to the second member in an operative state, and bringing said support and positioning structure to a non-operative state. Suitably, said method comprises a further step of bringing the support and positioning structure back into the operative state.

BRIEF DESCRIPTION OF THE DRAWINGS

These and other aspects of the invention will be further elucidated with reference to the Figures, in which.

DESCRIPTION OF ILLUSTRATIVE EMBODIMENTS

In the figures, identical reference numbers relate to identical or at least comparable technical features. The Figures are not drawn to scale and intended for illustrative purposes only. The Figures show examples, which are not intended to limit the claims anyhow.

Figure 1:
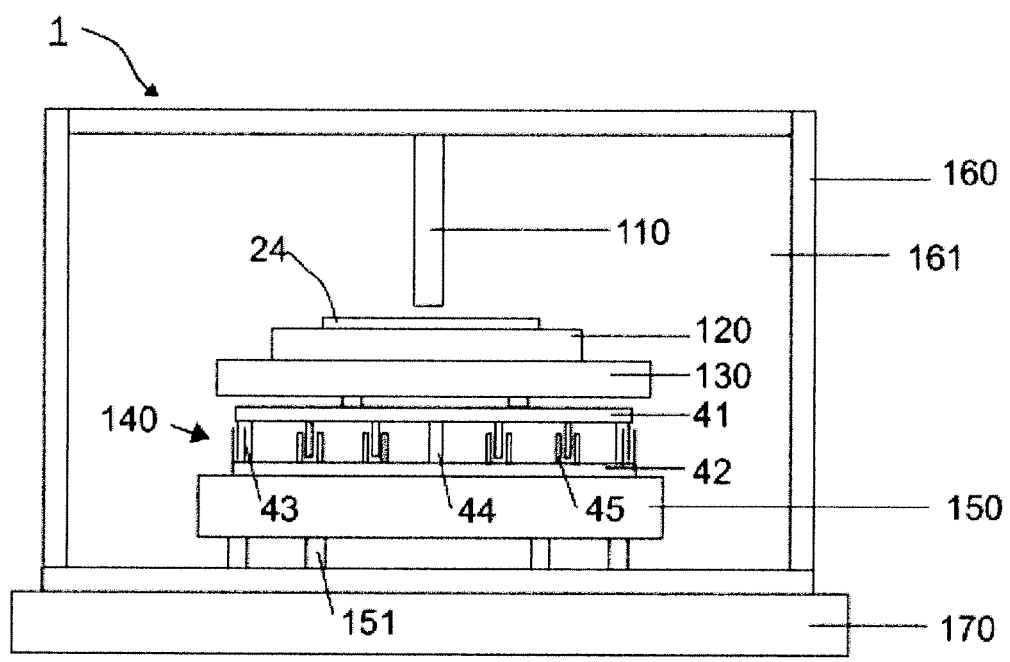
FIG. 1 shows a simplified schematic cross-sectional figure of a charged particle system of the invention

FIG. 1 shows a schematic cross-sectional view of the semiconductor equipment system 1 according to the invention. The equipment system 1 shown in the present figure is a system with a column 110, and more particularly a lithographic system or an inspection system. Specifically, it is a system in which charged particles beamlets are transmitted to the surface of a target 24. This target 24 is for instance a semiconductor wafer or a mask, though other targets such as an assembly carrier are not excluded.

In operation, the column 110 transmits beamlets to the target 24. In the case of a lithographic system, the beamlets are transmitted so as to transfer a pattern to at least a major portion of the surface of the target 24. Thereto, the column 110 needs to be moved relatively to the target 24 or vice versa. Usually, the target 24 and the underlying structure is moved. The target is thereto supported by a positioning and support structure, also referred to as a stage, that typically includes several elements.

A translator and rotator 150 is present for movements and rotations in a plane substantially parallel to the target, hereinafter referred to as the x-y plane. The translator and rotator 150 may comprise several elements for separate movement in different directions and for different scales of movement. The translator and rotator 150 and other portions of the stage are connected to a base frame 170 through supports 151. These supports pass a chamber wall 160. The chamber wall 160 ensures a controlled operation atmosphere within the enclosed chamber 161. Suitably, the atmosphere in the chamber is vacuum, more preferably an high or ultrahigh vacuum.

A fine-tuning positioning and support structure 140 is present on top of the translator and rotator 150. Suitably, it provides including positioners 45 for fine-tuning a position of the target 24 in six degrees of freedom; i.e. the lateral (x-y)-dimensions in the plane of the target 24, the vertical (z-) dimension normal to the plane of the target 24, as well as rotations in the x-y, x-z and y-z planes. The movement provided by these positioners 45 is effectively movement of its first member 41 relative to its second member 42. The positioners 45 are typically electro motors, more preferably linear motors and most preferably Lorenz motors. The number of positioners 45 depends on the choice and capability of such positioners. Typically, one uses 6 to 10 individual positioners. A shield 43 is present so as to protect the chamber 161 against magnetic fields generated in the course of operation of the positioners 45. The shield 43 is shown in this FIG. 1 as on the side faces of the structure 140 only. However, the shield suitably is present so as to enclose said fine-tuning structure 140. According to one aspect of the invention, the shield includes a first and a second shield part, said first shield part coupled to the first member 41 and said second shield part coupled to the second member 42, wherein the first and the second shield part are movable to each other.

The first member 41 of the fine-tuning structure 140 is attached to the chuck 130. This chuck 130 supports a wafer table 120, on top of which the target 24 is present. The wafer table 120 is typically reversibly attached to the chuck 130, so as to enable effective transfer of the target 24. Such transfer is typically carried out to move the target 24 to another semiconductor equipment system for a subsequent manufacturing step.

Lithography systems for use in manufacture of advanced integrated circuits and masks provide Lithography at deep submicron scales, particularly with minimum dimensions of less than 100 nm. Ongoing developments even extend such deep submicron scales to minimum dimensions of less than 30 nm. Adequate operation at such dimensions does not merely require advanced optical or electron-optical lithography within the column 110, but also very precise and well controlled positioning in the stage. Moreover, disturbances typically resulting from the operation of motors and other elements easily bring the positioning out of the required specification. One type of disturbance is the generation of heat: heating of the stage with one grade Celsius or less may bring the positioning outside specifications. Another type of disturbance is the generation of stray fields, particularly magnetic fields. Lithography systems and inspection systems operating on the basis of charged particles beamlets are particularly sensitive to this type of disturbance, as any magnetic or electric field may lead to slight and uncontrollable deflections of such charged particle beamlets. Such deflections would make that the pattern is not transferred to the surface of the target 24 as specified, hence leading to usually irreparable loss of the target 24. The requirements for the magnetic field in the chamber 161 are thereto extremely strict; e.g. a magnetic field in the order of nanoTeslas is allowed, whereas electro motors typically generate fields in the order of Teslas; in other words a ratio of magnetic field strength up to a trillion or more is required. And it is additionally desired to have the fine-tuning structure 140 inside the chamber 161 of controlled atmosphere.

The invention overcomes this problem in that the fine-tuning structure 140 is provided with a shield 43 distributed over the first and second members 41, 42 such that the first and second shield part are movable to each other and nevertheless enable sufficient shielding of the magnetic field within the fine-tuning structure. Suitably, less than 0.1%, more suitably less than 1 ppm (parts per million) of the magnetic field passes the shield distributed over the first and the second members 41, 42. The distribution of the shield over the first and second members turns out more advantageous than individually encapsulating each positioner 45 such as to shield its magnetic field. Not only is a distribution over the members 41, 42, as part of the encapsulation of the fine tuning structure 140 less voluminous, but also may the magnetic field generated by all positioners 45 together be more regular (less fluctuating) and at least relatively smaller in magnitude than the magnetic field generated by a single electromotor 45. Additionally, the distribution of the shield over the first and second member allows a focus on the shielding at the area that most deserves it. This area is constituted in particular by the one or more side faces of the fine tuning structure 140. In combination herewith, it is suitable that the positioners are located such that the primary direction of the magnetic field is lateral, e.g. towards one of the side faces. This is achieved with a vertical orientation of plates making up the electromotor 45.

In a preferred embodiment, the shield 43 is constituted by a first and a second shield part, being part of the first and the second member 41, 42 respectively, that have mutually an area of overlap. More suitably, the first shield part is located in between of the second shield part. This increases the length of an escape way for the electromagnetic field considerably and it still allows translation into the vertical z-direction. Preferably, such shield part is shaped as a comb structure. The comb structures of the first and second shield part are designed to fit together. This type of structures provides a sufficient shielding while leaving sufficient space for fine-tuning movements in all six degrees of freedom.

In an even further implementation, the fine-tuning structure is provided with a plurality of side faces, such that a first and an adjacent second side face include an angle of more than 90 degrees and less than 180 degrees, preferably between 120 and 180 degrees. It has been observed that the use of such oblique angles in the fine-tuning structure 140 allows more movement. This observation has been done in comparison to sharp angles and relates particularly the rotational degrees of freedom (xy, xz and yz plane). Use of a fine-tuning structure 140 without any more or less straight side faces, such as an elliptical or round side face, turns out to limit in particular the translational degrees of freedom (x,y).

Figure 2:
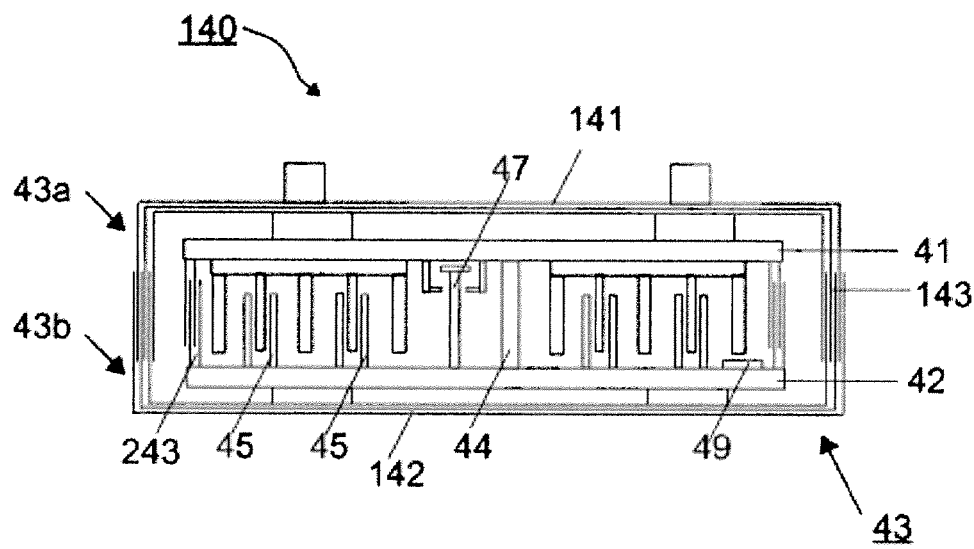
FIG. 2 shows a schematic cross-sectional view of one embodiment of the fine-tuning positioning and support structure according to the invention in an operative state.
Figure 3:
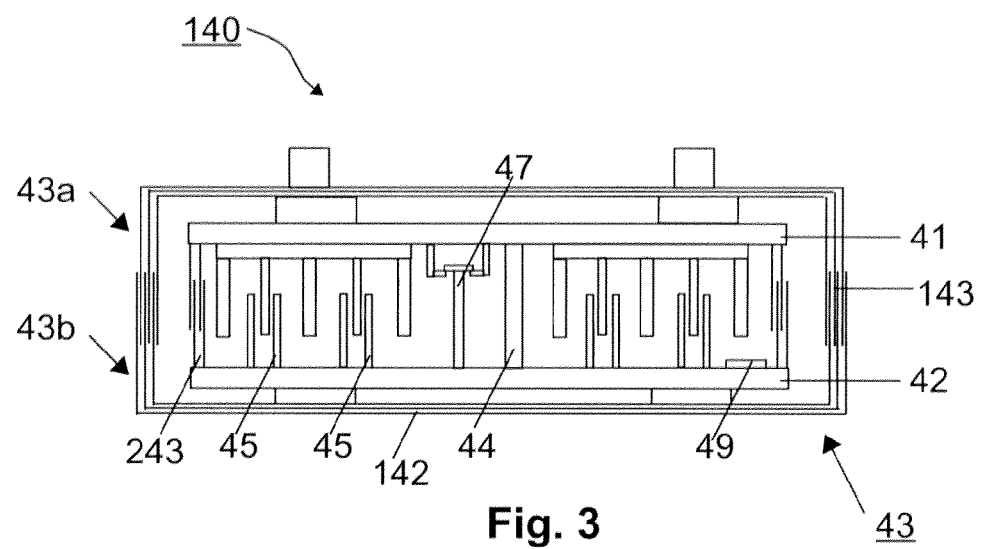
FIG. 3 shows a schematic cross-sectional view of the embodiment of FIG. 2 in a non-operative state.

FIG. 2 and FIG. 3 show schematically in cross-sectional view the fine-tuning structure 140 of the present invention in a preferred configuration and with the additional functionality of a non-operative state in addition to an operative state. FIG. 2 shows herein the structure 140 in the operative state and FIG. 3 shows the structure 140 in the non-operative state. The non-operative state is the state wherein the electro motors 45 are turned to a low-power mode and wherein the positioning is fixed. The electro motors 45 are preferably all switched off in said low-power mode. Alternatively, only some are switched off and/or some motors operate at low-power or enter a 'standby' configuration. The non-operative state has at least two major advantages: first, heating of the fine-tuning structure 140 occurs at lower rate or even not at all, due to the low-power state of the electro motors 45. Secondly, the non-operative state may be used as a reference position when implemented appropriately.

The FIGS. 2 and 3 additionally show a preferred implementation of the shield 43 having a first shield part 43a and a second shield part 43b with some more advantageous features. Preferably, a heat removal means, such as a heat sink or heat conductor is provided between the second member 42 and the translator and rotator 150. Therewith, the heat conduction away from the target 24 is made better than that towards the target 24. The first member 41, which is the most relevant element for positioning accuracy, will thus be affected by heating up and/or temperature variations the least.

Another feature shown in FIGS. 2 and 3 is the provision of an interdigitated structure in the outer shield 143, wherein the number of overlapping plates is at least 5. The difference in shielding effect between a five layered shield and a four layered shield turns out much larger than that between a shield composed of five layers and of six layers. A further necessary feature of the shield implementation shown in FIG. 2 and FIG. 3 is the continuity of the shield at a top side 141 and a bottom side 142 of the fine-tuning structure 140. Such continuity prefers leakage at the edges and/or mechanical connections between the shield part 43a, 43b and the rest of the first or second member 41, 42 respectively. Materials for such isolation the various portions of the shield 43 are known to a skilled person. One suitable material for the shield is a so-called p-material.

For entering the non-operative state, the spring 44, the sensor 49 and the limiter 47 are relevant elements. The FIGS. 2 and 3 show merely one sensor 49 and one limiter 47, but it may be understood that a plurality of those, for instance 2, 3, 4, 5 or 6, are available, one for each degree of freedom that has to be controlled. Instead of one spring, a plurality of springs may be present. The spring may have a coil configuration, but that is not deemed necessary. Other elements having spring characteristics, including a magnetic suction member and a repulsive magnet could be applied alternatively. The spring is preferably adjusted for bearing the tare weight of the first member 41, the chuck 130 and the wafer table 120. In this manner, the spring can be designed to have a very small spring constant in a tare bearing direction and other five degree-of-freedom directions, so that transfer of vibrations from base frame 170 through the spring 44 to the wafer table 120 is almost negligible. Additionally, heat generation of the motors can be inhibited.

The non-operative state may be entered into on the basis of various start signals. One such start signal is an electrical signal provided by a central controller. Such central controller may provide the signal on the basis of a failure detection, on the basis of a specific user instruction, when no power is available and/or for reviewing the reference position. Another such start signal is a sudden change in the weight supported by the fine-tuning structure 140, and more specifically, a sudden weight reduction. This sudden weight reduction is for instance due to removal of the wafer table 120 and tends to lift the first member 41 upwards, i.e. away from the second member 42. The sensor 49 is a sensor dedicated to sensing of such a change in position. Suitably, the sensor optically senses a distance to the first member 41, while being positioned on the second member 42. This is however merely one implementation. The sensor 49 may alternatively be positioned on the first member 41 and may use alternatively sensing principles, including sensing of motion, for instance with a magneto resistive sensor or a MEMS-based accelerometer.

The position of the first member 41 is stabilized, after having entered the non-operative state, through one or more mechanical locks 47. A variety of mechanical locks 47 is suitable thereto, as known per se to a skilled person in the art of mechanics. The type of mechanical lock 47 tends to depend on the position, into which the fine-tuning structure 49 is entered when entering the non-operative state. One advantageous position is an elevated position. Such a position prevents that plates touch each other, when present within a type of shield 43 that is implemented as a series of interdigitated plates. Such an elevated position additionally allows that certain mechanical vibrations arriving through the translator and rotator 150 to the fine-tuning member 140 are corrected and/or damped off. The mechanical lock 47 may be provided as a distance limiter—also known as a stop—in the case that an elevated position is chosen for the non-operative state. The distance limiter 47 or plurality of distance limiters, effectively limits the extension of the spring 44 to a maximum length. FIG. 2 shows how such distance limiter 47 is ineffective in the operative state. FIG. 3 shows that the distance limiter 47 effectively limits the extension of the spring 44 in the non-operative state. The extent of elevation is designed, such that the first and second shield parts 43a, 43b overlap each other. More specifically, this overlap is sufficient so as to meet the shielding requirements. Both the shown location of the distance limiter 47 and the difference in positioning between the operative and non-operative state are purely intended for illustrative purposes and not drawn to scale. It is further observed that the distance limiter 47 may alternatively be provided in a reverse orientation, e.g. with its limiting portion attached to the second member instead of to the first member.

Figure 4:
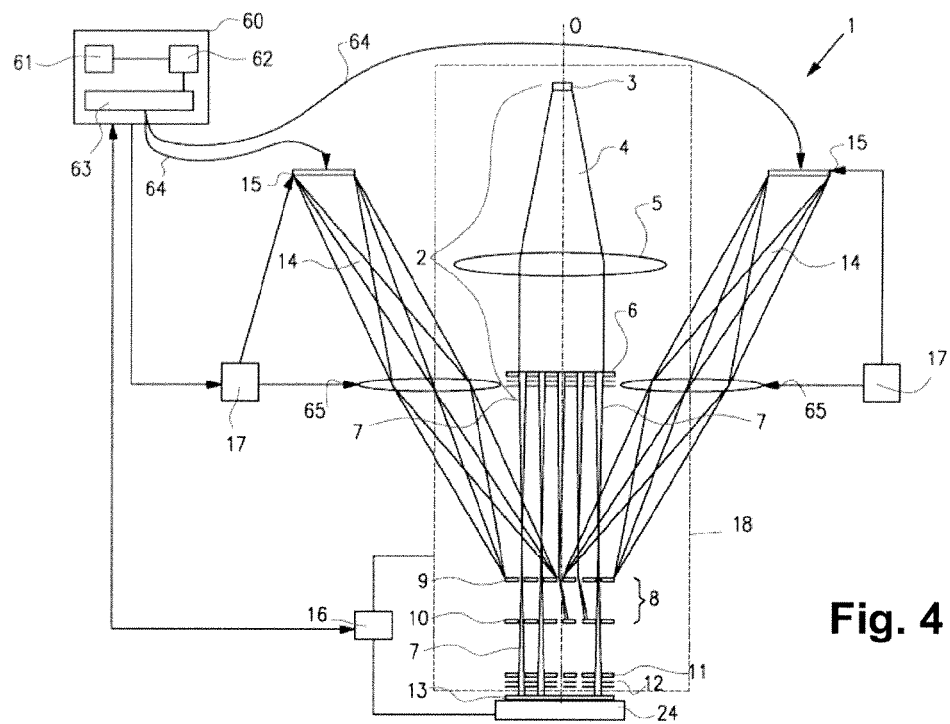
FIG. 4 shows a simplified schematic drawing of an embodiment of a charged particle multi-beamlet lithography system.

FIG. 4 shows a simplified schematic drawing of an embodiment of a charged particle multi-beamlet lithography system 1 based upon an electron beam optical system without a common cross-over of all the electron beamlets. Such lithography systems are described for example in U.S. Pat. Nos. 6,897,458 and 6,958,804 and 7,084,414 and 7,129,502, which are hereby incorporated by reference in their entirety, assigned to the owner if the present invention. Such a lithography system suitably comprises a beamlet generator generating a plurality of beamlets, a beamlet modulator patterning said beamlets into modulated beamlets, and a beamlet projector for projecting said beamlets onto a surface of a target. The beamlet generator typically comprises a source and at least one aperture array. The beamlet modulator is typically a beamlet blanker with a blanking deflector array and a beam stop array. The beamlet projector typically comprises a scanning deflector and a projection lens system. FIG. 4 does not show explicitly the positioning and support structure of the present invention.

In the embodiment shown in FIG. 1, the lithography system comprises an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 passes a double octopole and subsequently a collimator lens 5 for collimating the electron beam 4. As will be understood, the collimator lens 5 may be any type of collimating optical system. Subsequently, the electron beam 4 impinges on a beam splitter, which is in one suitable embodiment an aperture array 6. The aperture array 6 blocks part of the beam and allows a plurality of beamlets 7 to pass through the aperture array 6. The aperture array preferably comprises a plate having through-holes. Thus, a plurality of parallel electron beamlets 7 is produced. The system generates a large number of beamlets 7, preferably about 10,000 to 1,000,000 beamlets, although it is of course possible to use more or less beamlets. Note that other known methods may also be used to generate collimated beamlets.

The plurality of electron beamlets 7 pass through a condenser lens array—not shown in the figure—which focuses each of the electron beamlets 7 in the plane of beamlet blanker array 9. This beamlet blanker array 9 preferably comprises a plurality of blankers, which are each capable of deflecting one or more of the electron beamlets 7. The beamlet blanker array 9 constitutes with a beam stop array 10 a modulating means 8. On the basis of input from a control unit 60, the modulating means 8 add a pattern to the electron beamlets 7. The pattern will be positioned on the target surface 13 by means of components present within an end module.

In this embodiment, the beam stop array 10 comprises an array of apertures for allowing beamlets to pass through. The beam stop array, in its basic form, comprises a substrate provided with through-holes, typically round holes although other shapes may also be used. In one embodiment, the substrate of the beam stop array 8 is formed from a silicon wafer with a regularly spaced array of through-holes, and may be coated with a surface layer of a metal to prevent surface charging.

In one embodiment, the passages of the beam stop array 10 are aligned with the elements of the beamlet blanker array 9. The beamlet blanker array 9 and the beamlet stop array 10 operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography system furthermore comprises a control unit 60 comprising data storage 61, a read out unit 62 and data converter 63. The control unit 60 may be located remote from the rest of the system, for instance outside the inner part of a clean room. Using optical fibers 64, modulated light beams holding pattern data are transmitted to a projector 65 which projects the ends of the fibers (schematically depicted in plate 15) into the electron optical unit 18, here on to the modulation array 9. Modulated light beams 8 from each optical fiber end are projected on a light sensitive element of a modulator on the beamlet blanker array 9. Each light beam 14 holds a part of the pattern data for controlling one or more modulators. Suitably, use is made of transmitting means 17 enabling that the projector 65 is appropriately aligned with the plate 15 at the ends of the fibers.

Subsequently, the electron beamlets 7 enter the end module. Hereinafter, the term 'beamlet' to refer to a modulated beamlet. Such a modulated beamlet effectively comprises time-wise sequential portions. Some of these sequential portions may have a lower intensity and preferably have zero intensity—i.e. portions stopped at the beam stop. Some portions will have zero intensity in order to allow positioning of the beamlet to a starting position for a subsequent scanning period.

The end module is preferably constructed as an insertable, replaceable unit, which comprises various components. In this embodiment, the end module comprises a beam stop array 10, a scanning deflector array 11, and a projection lens arrangement 12, although not all of these need be included in the end module and they may be arranged differently. The end module will, amongst other functions, provide a demagnification of about 100 to 500 times, preferably as large as possible, e.g. in the range 300 to 500 times. The end module preferably deflects the beamlets as described below. After leaving the end module, the beamlets 7 impinge on a target surface 13 positioned at a target plane. For lithography applications, the target usually comprises a wafer provided with a charged-particle sensitive layer or resist layer.

After passing the beamlet stop array 10, the thus modulated beamlets 7 pass through a scanning deflector array 11 that provides for deflection of each beamlet 7 in the X- and/or Y-direction, substantially perpendicular to the direction of the undeflected beamlets 7. In this invention, the deflector array 11 is a scanning electrostatic deflector enabling the application of relatively small driving voltages, as will be explained hereinafter. Next, the beamlets 21 pass through projection lens arrangement 12 and are projected onto a target surface 13 of a target, typically a wafer, in a target plane. The projection lens arrangement 12 focuses the beamlet, preferably resulting in a geometric spot size of about 10 to 30 nanometers in diameter. The projection lens arrangement 12 in such a design preferably provides a demagnification of about 100 to 500 times. In this preferred embodiment, the projection lens arrangement 12 is advantageously located close to the target surface 13.

Such high-quality projection is relevant to obtain a lithography system that provides a reproducible result. Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography systems make use of a plurality of beamlets. No difference in irradiation ought to result from deflection steps.

Figure 5:
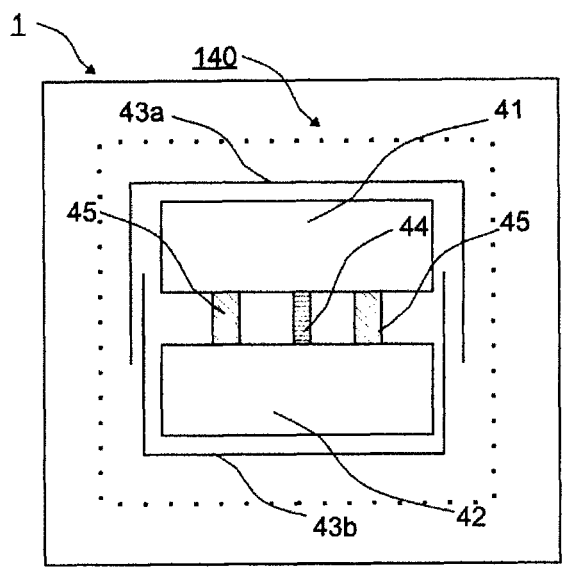
FIG. 5 shows a simplified schematic drawing of an embodiment of a positioning and support structure in a charged particle system.

FIG. 5 shows a simplified schematic drawing of an embodiment of a positioning and support structure 140 in a charged particle system 1. The first member 41, adapted for carrying a target such as a wafer, is coupled to second member 42 by means of electro motors 45 and spring 44 in such a manner that first member 41 and second member 42 are moveable towards each other and apart. For clarity, only 2 electro motors are shown, this number may be appropriately higher to allow positioning in 6 degrees of freedom. The first shield part 43a is fixed to first member 41, the second shield part 43b is fixed to second member 42. Shield parts 43a and 43b overlap so as to complete the shield. When electro motors 45 are actuated identically, first member 41 and second member 42 will be moved relative to each other, whilst staying parallel to each other. At this time, the overlap between shield parts 43a and 43b remains sufficient to complete the shield. By actuating each of the electro motors 45 in a non-identical manner, first member 41 and second member will also move relative to each other and will also tilt, not remaining parallel. At this time, the overlap between shield parts 43a and 43b remains sufficient to complete the shield, while the space between shield part 43a and 43b allows for tilt without the shield parts touching. Spring 44 is free not only to extend and contract, but also to allow movement to facilitate tilting of first member 41 and second member 42.

Figure 6:
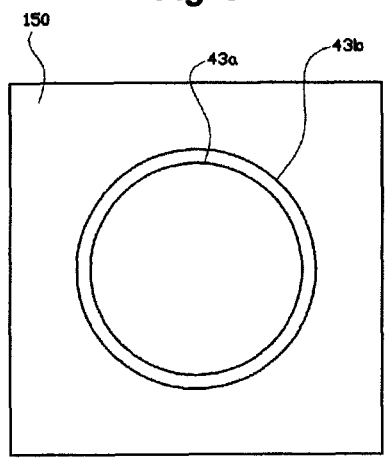
FIG. 6 schematically shows a top view of a support and positioning structure provided with a first and a second shield part.

FIG. 6 shows a top view of a support and positioning structure provided with a first shield part 43a and a second shield part 43b, the first and second shield parts being of a circular shape.

In addition to the preceding description and introductory part, the present invention, apart from the following set of claims, also relates to all non-further elucidated details and aspects in the drawing which are however directly and unambiguously derivable there from by a person skilled in the art.

The invention claimed is:

1. A charged particle beam system (1) for transmitting at least one charged particle beam onto the surface of a target (24), wherein said charged particle beam system is provided with a support and positioning structure (140) for supporting and positioning said target (24) on a table (120), the support and positioning structure (140) comprising:
   a first member (41) and a second member (42);
   a fine tuning structure comprising at least one motor (45), and adapted for moving the first member (41) relative to the second member (42) in at least a first direction and a second direction, said second direction being perpendicular to said first direction, and for rotating the first member (41) relative to the second member (42) around an axis perpendicular to said first and second directions;
   a spring (44) mechanically coupling the first member (41) and the second member (42) for at least partially bearing the weight of the first member (41), table (120) and target (24);
   a shielding structure (43) which encloses said fine tuning structure, for shielding said at least one charged particle beam located outside of said shielding structure from electromagnetic fields generated by said at least one motor (45) located within said shielding structure, said shielding structure (43) comprising a first shield part (43a) and a second shield part (43b),
   wherein said first member (41) and said second member (42) are at least partially shielded by said first shield part (43a) and said second shield part (43b), the first and second shield parts being movable with respect to each other in conjunction with said first and second members, wherein the first and second shield parts each comprise a plurality of plates, each plate of said pluralities of plates comprising a planar portion (141;142) and a side portion, wherein each planar portion extends substantially parallel to a main surface of said first member (41) and each side portion has an orientation different from said planar portion (141;142), wherein said side portions of said first and second shield part overlap, and wherein said plurality of plates of said first shield part are spaced apart from each other, and wherein said plurality of plates of said second shield part are spaced apart from each other.

2. The system as claimed in claim 1, wherein at least one of the shield parts comprises a first and a second plate extending in parallel, such that said side portion of the other shield part extends in between of the first and the second plate.

3. The system as claimed in claim 2, wherein at least one of the shield parts includes a plurality of plates so as to constitute, in a cross-sectional view, a comb structure.

4. The system as claimed in claim 3, wherein both of the shield parts include a plurality of plates that are arranged so as to constitute an interdigitated structure.

5. The system as claimed in claim 4, wherein the interdigitated structure is included to allow rotations and translations between said first and second shield parts.

6. The system as claimed in claim 2, wherein said plurality of plates are oriented a direction parallel to an optical axis of the system.

7. The system as claimed in claim 1, wherein the shield is of a circular shape.

8. The system according to claim 1, wherein motors are included for providing 6 degrees of freedom.

9. The system according to claim 1, wherein the at least one motor is a Lorentz motor.

10. The system according to claim 1, wherein said system is operated under controlled atmosphere.

11. The system as claimed in claim 10, wherein said controlled atmosphere comprises a vacuum environment.

12. The system according to claim 1, wherein the system is a system chosen from the group of measurement systems and lithography systems.

13. The system according to claim 1, wherein the system includes a column for the projection of at least one charged particle beam on a target surface.

14. The system claimed in claim 1, wherein the first member is urged against a stop by said spring when the one or more motors are powered off.

15. The system as claimed in claim 1, wherein the spring has an effective length that is larger when the motors are powered off than when the motors are powered on.

16. The system as claimed in claim 1, wherein said plurality of plates are oriented a direction parallel to an optical axis of the system.

17. A charged particle system for use in a semiconductor equipment system comprising a positioning and support structure, said positioning and support structure comprising:

a first member and a second member and a fine tuning structure comprising at least one motor so as to move the first member relative to the second member in at least a first direction and a second direction, said second direction being perpendicular to said first direction, and a rotation around an axis perpendicular to said first and second directions, a shielding structure so as to shield a column above said first member from electromagnetic fields generated by said at least one motor, which shielding structure comprises a first shield part and a second shield part, which first member comprises said first shield part and which second member comprises said second shield part, the first and second shield part being movable with respect to each other in conjunction with said first and second members, a spring mechanically coupling the first member and the second member for at least partially bearing the weight of the first member, chuck, table and target and wherein said shielding structure encloses said fine tuning structure, and, wherein said first member and said second member are at least partially shielded by said first shield part and said second shield part in conjunction, the first and second shield part being movable with respect to each other in conjunction with said first and second members, and wherein the first and second shield part each comprise a plurality of plates, each plate of said pluralities of plates comprising a planar portion (141;142) and a side portion, wherein each planar portion extends substantially parallel to a main surface of said first member (41) and each side portion has an orientation different from said planar portion (141;142), wherein said side portions of said first and second shield part overlap, and wherein said plurality of plates of said first shield part are spaced apart from each other, and wherein said plurality of plates of said second shield part are spaced apart from each other.

18. A method of positioning an element in a semiconductor equipment system, comprising the steps of:

mechanically coupling said element to a first member of a support and positioning structure said support and positioning structure further comprising a second member and a fine tuning structure comprising at least one motor;

operating the at least one motor for positioning the first member relative to the second member in at least a first direction and a second direction, said second direction being perpendicular to said first direction, and a rotation around an axis perpendicular to said first and second directions;

providing a shielding structure enclosing said fine tuning structure for shielding at least one charged particle beam above said first member from electromagnetic fields generated by said at least one motor (45) located within said shielding structure, using a distributed shield comprising a first and a second shield part for enabling movement of the first member relative to the second member resulting from said motor, wherein the first and second shield part each comprise a plurality of plates, each plate of said pluralities of plates comprising a planar portion (141;142) and a side portion, wherein each planar portion extends substantially parallel to a main surface of said first member (41) and each side portion has an orientation different from said planar portion (141;142), wherein said side portions of said first and second shield part overlap, and wherein said plurality of plates of said first shield part are spaced apart from each other, and wherein said plurality of plates of said second shield part are spaced apart from each other.

* * * * *